United States Patent [19]

Brahms et al.

[11] Patent Number: 5,059,918
[45] Date of Patent: Oct. 22, 1991

[54] PROCEDURE AND APPARATUS FOR AMPLIFICATION OF A BURST SIGNAL

[75] Inventors: Martin Brahms, Hanover; Andreas Hennig, Garbsen; Andreas Timmermann, Ronnenberg, all of Fed. Rep. of Germany

[73] Assignee: ke Kommunikations Elektronik, Hanover, Fed. Rep. of Germany

[21] Appl. No.: 591,629

[22] Filed: Oct. 2, 1990

[30] Foreign Application Priority Data

Oct. 14, 1989 [DE] Fed. Rep. of Germany ....... 3934384

[51] Int. Cl.$^5$ .............................................. H03G 3/30
[52] U.S. Cl. .................................... 330/11; 330/129; 375/38
[58] Field of Search ................... 307/234, 355; 330/11, 330/129, 279, 302; 375/7, 38

[56] References Cited

U.S. PATENT DOCUMENTS 3,872,255  3/1975  Namce et al. ...................... 375/28 X
4,606,047  8/1986  Wilkinson ............................. 375/38

Primary Examiner—Steven Mottola
Attorney, Agent, or Firm—Peter C. Van Der Sluys

[57] ABSTRACT

A controllable amplifier, which has two symmetrical outputs, at which two output signals mirror-symmetrical with respect to each other are present, is used for amplification of a burst signal. To achieve the largest possible eye opening of the signals to be fed to a comparator, a predetermined d.c. voltage difference for the formation of matched signals is adjusted for both output signals. After this, the arithmetic mean values of the two matched signals are formed and are fed to a second comparator. The output value of the second comparator is fed to an integrator, to which a reference voltage is also fed. In case of a deviation of the mean values of the two matched signals from each other, the amplifier is adjusted in a compensating direction by the integrator.

4 Claims, 1 Drawing Sheet

PROCEDURE AND APPARATUS FOR AMPLIFICATION OF A BURST SIGNAL

BACKGROUND OF THE INVENTION

1. Field of the Invention

The present invention relates to a procedure and apparatus for amplification of a burst signal, as is used in the bidirectional transmission of communications signals in a time-division multiplex (TDM) procedure.

2. Description of the Prior Art

In a TDM system, the signals in both transmission directions are conducted over the same signal path, which can be formed by metallic conductors or optical waveguides. Between the individual bursts transmitted in one direction, in which a continuous data stream is contained in a form compressed with respect to time, there are relatively large time differences, which are intended for transmission of bursts in the opposite direction. What is present in burst operation is therefore not a continuous, but a strongly discontinuous data signal transmission. This type of signal transmission requires a satisfactory further processing of the signals, the bursts, in regenerators and receivers which use comparators.

SUMMARY OF THE INVENTION

The invention is based on the task of providing a procedure by means of which, in the amplification of burst signals, the largest possible eye opening can be produced in a simple manner.

According to the invention, this task is solved by the fact that the burst signal is fed to a controllable amplifier with two symmetrical outputs, at which two output signals mirror-symmetrical with respect to each other are present, that a predetermined d.c. voltage difference for the formation of matched signals is adjusted for the two output signals, that the arithmetic mean values of the two matched signals are formed and are fed to a comparator, that the output value of the comparator is fed to an integrator, to which a reference voltage is also supplied, and that, in the case of deviation of the mean values of the two matched signals from each other, the amplifier is adjusted in the compensating direction by means of the integrator.

In this procedure, a defined d.c. voltage difference is initially established between the two mirror-symmetrical output signals of the amplifier, for example, by means of a simple RC network. The amplification of the signals is controlled in such a way that the arithmetic mean values of the signals matched by the RC network are located at the same potential. This results in a maximum eye opening of the bursts, so that a comparator connected in series can make the best possible decision. A simple comparator can therefore be used. The formation of the arithmetic mean values of the two matched signals is also very simple, for example, with the use of lowpass filters, which can be simple, RC elements. By means of the comparator and the integrator connected in series, the amplifier is continuously adjusted in a compensating direction without major effort, so that bursts with a maximum eye opening are continuously fed to the amplitude decider. Despite the discontinuous operation, a satisfactory amplification or regeneration of the bursts signals is thus ensured in a simple manner.

The procedure according to the invention is explained by means of examples below, with reference to the drawings.

DETAILED DESCRIPTION OF THE PREFERRED EMBODIMENT

Figure 1:
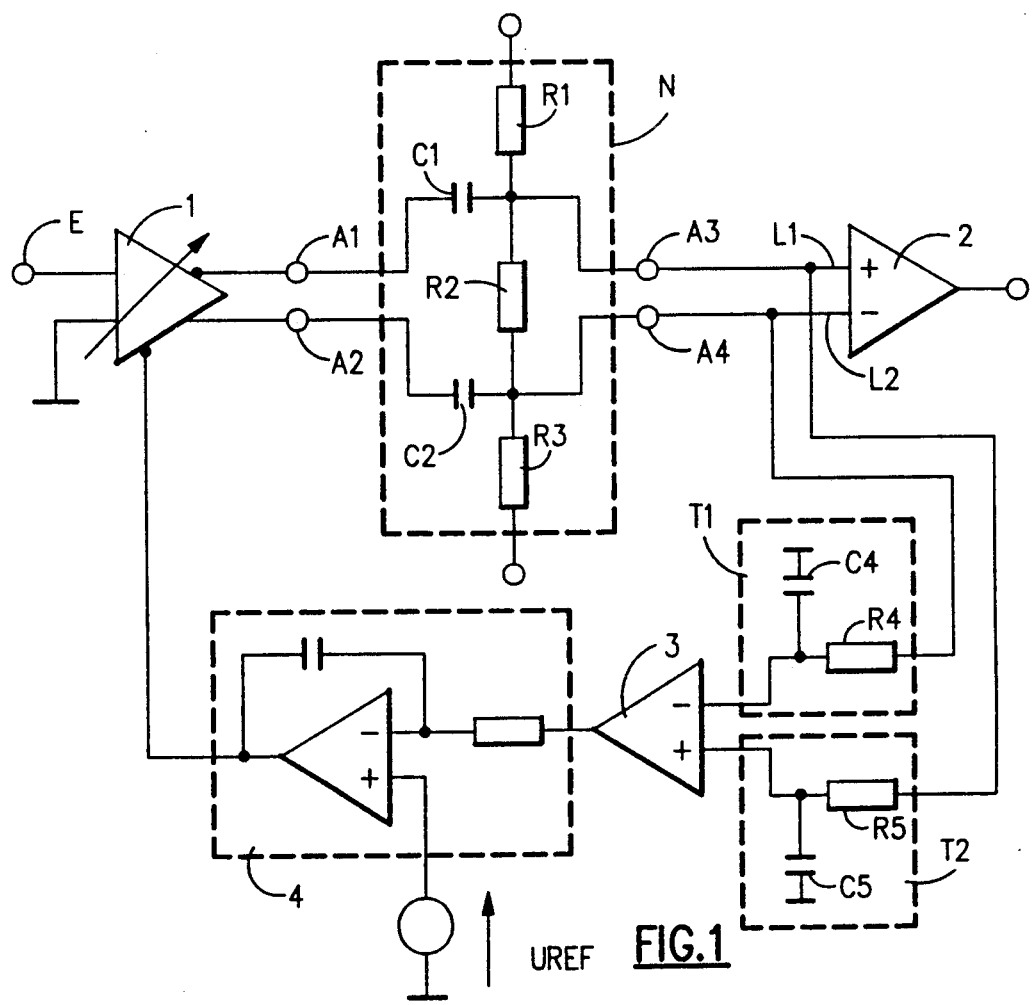
FIG. 1 is a schematic representation of a circuit arrangement for execution of the procedure according to the invention.

FIG. 1 shows a circuit arrangement for amplification of a burst signal in a very simple embodiment, in which only the parts required for an understanding of the invention have been shown.

Figure 2:
FIG. 2 is an excerpt of a signal to be processed.

By means of an input E there is fed to a controllable amplifier 1 a burst signal, an excerpt of which is shown, in principle in FIG. 2. A burst signal of this type is used in communication transmission, particularly in the TDM systems, in which, in the intervals between two bursts of one transmission direction, the bursts of the other direction are transmitted via the same signal path. The intervals between the bursts are very long in comparison with the time length of the bursts, so that a strongly discontinuous data signal is produced overall. The amplified burst signal is fed to a comparator 2.

Figure 3:
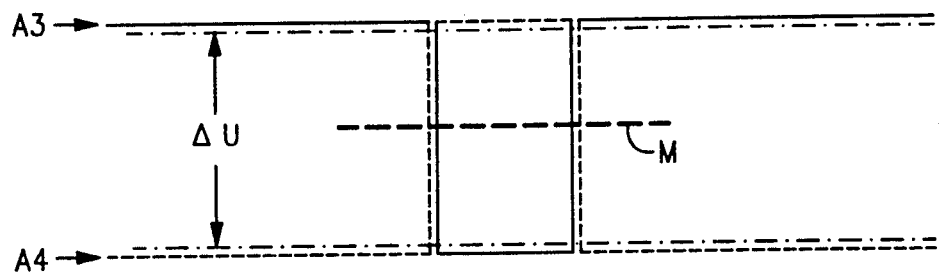
FIG. 3 shows the signals after the amplifier, in enlarged representation.

The controllable amplifier 1 has a control input R and two symmetrical or complementary outputs A1 and A2, at which there are provided two mirror-symmetrical signals, which are inverted in terms of a.c. voltage. A defined d.c. voltage difference for the two output signals is formed by means of a RC network N, enclosed by broken lines in the FIG. 1. The RC network N includes capacitors C1 and C2 and the resistors R1, R2 and R3. In this way, the arithmetic mean values or zero lines of the two output signals are related to each other in a specific manner. The zero lines of the two output signals of the amplifier 1 are shown by dash-dotted lines in FIG. 3. The potential difference between them is designated as $\Delta U$. At the outputs A3 and A4 of the RC network N there are thus present signals which, by specification of their zero lines, have a preset position or a preset distance from each other, so that they can be superposed. The signals present at A3 and A4 will be referred to as "matched signals" below.

The matched signals are conducted separately over the lines L1 and L2 and are fed to an amplitude comparator 2. They are also tapped off separately, and are fed to lowpass filters T1 and T2 to form their arithmetic mean values. With the circuit shown in FIG. 1, only the bursts of the signals are used for the formation of the mean values. In the present case, RC elements with the resistors R4 and R5 and the capacitors C4 and C5 are used as the lowpass filters T1 and T2. However, LR elements or active integrators can also be used.

The mean values of the two matched signals are fed to a comparator 3, which compares these mean values or their position with their respect to each other. To the comparator 3 there is connected an integrator 4 with an input, to which a reference voltage UREF is fed via another input. The output of the integrator 4 is connected to the control input R of the amplifier 1. In the case of a deviation of the mean values of the matched signals from each other, the amplifier 1 is adjusted in a compensating direction by means of the integrator 4. This means that, in order to achieve the largest possible eye opening of the bursts reaching the comparator 2, the mean values of the two matched signals are located on the line M drawn in as a dashed line in FIG. 3.

To form the mean values of the two matched signals—as described—only the bursts themselves are used in a preferred embodiment. The formation of the mean values thus becomes independent of the time length of the bursts and the burst intervals. If the whole burst signal is used for formation of the mean values, then it is necessary to also take into consideration at least the peak value (amplitude) of the bursts and the burst/interval ratio.

What is claimed is:

1. A procedure for amplification of a burst signal, comprising the steps of:

feeding the burst signal to a controllable amplifier (1) with two symmetrical outputs (A1, A2), at which two output signals mirror-symmetrical with respect to each other are present;

adjusting the two output signals so that a predetermined d.c. voltage difference ($\Delta U$) is provided for the formation of matched signals;

forming the arithmetic mean values of the two matched signals and feeding the mean values to a comparator (3);

feeding the output value of the comparator (3) to an integrator (4), to which a reference voltage (UREF) is also supplied; and adjusting the amplifier (1) in a compensating direction by means of an output from the integrator (4) in the event of a deviation between the mean values of the two matched signals.

2. A procedure according to claim 1, wherein only the bursts are used for the formation of the mean values of the two matched signals.

3. A circuit arrangement for amplification of a burst signal, comprising:

a controlled amplifier (1) having an input for receiving the burst signal and two symmetrical outputs (A1, A2) for providing two mirror-symmetrical output signals;

a RC network (N) having two inputs connected to the two symmetrical outputs (A1, A2) and having two outputs (A3, A4);

a lowpass filter (T1, T2) having a pair of inputs connected to the outputs (A3, A4) of the RC network (N) and providing two outputs;

a comparator (3) having two inputs connected to the two outputs of the lowpass filter (T1, T2), said comparator also having an output; and an integrator (4) having an input connected to receive the output of the comparator (3) and a second input for receiving a reference voltage (UREF) and having an output connected to a control input (R) of the amplifier (1).

4. A circuit arrangement as described in claim 3, wherein the lowpass filter comprises RC elements.

* * * * *